(12) United States Patent
Li et al.

(10) Patent No.: US 8,980,656 B2
(45) Date of Patent: Mar. 17, 2015

(54) METHOD OF FORMING AN ARRAY OF HIGH ASPECT RATIO SEMICONDUCTOR NANOSTRUCTURES

(75) Inventors: Xiuling Li, Champaign, IL (US);
Nicholas X. Fang, Belmont, MA (US);
Placid M. Ferreira, Champaign, IL (US); Winston Chern, Cincinnati, OH (US); Ik Su Chun, Aloha, OR (US);
Keng Hao Hsu, Savoy, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 459 days.

(21) Appl. No.: 13/503,123

(22) PCT Filed: Oct. 14, 2010

(86) PCT No.: PCT/US2010/052581
§ 371 (c)(1),
(2), (4) Date: Nov. 6, 2012

(87) PCT Pub. No.: WO2011/049804
PCT Pub. Date: Apr. 28, 2011

(65) Prior Publication Data
US 2013/0052762 A1    Feb. 28, 2013

Related U.S. Application Data (60) Provisional application No. 61/253,700, filed on Oct. 21, 2009.

(51) Int. Cl.
*H01L 21/00* (2006.01)
*H01L 21/308* (2006.01)
(Continued)

(52) U.S. Cl.
CPC .............. *H01L 21/3081* (2013.01); *B82Y 10/00* (2013.01); *B82Y 40/00* (2013.01); *H01L 21/3086* (2013.01); *H01L 29/0676* (2013.01); *Y10S 977/893* (2013.01)
USPC ....................... 438/22; 257/E33.005; 977/893

(58) Field of Classification Search
CPC ........ B82Y 30/00; B82Y 40/00; B82Y 20/00; H01G 11/54; H01L 21/67017; H01L 29/0673
USPC ............... 438/22, 478; 977/893; 257/E21.09, 257/E33.005
See application file for complete search history.

(56) References Cited

U.S. PATENT DOCUMENTS

| 6,790,782 B1 | 9/2004 | Yang et al. ..................... 438/706 |
| 2004/0013982 A1* | 1/2004 | Jacobson et al. ............... 430/320 |

(Continued)

FOREIGN PATENT DOCUMENTS

| KR | 10-2007-0093461 | 9/2007 | ............. H01L 21/18 |
| WO | WO 2006/078281 A2 | 7/2006 | ............. H01L 21/20 |

OTHER PUBLICATIONS

International Search Report and Written Opinion dated Jun. 24, 2011 for International Application No. PCT/US2010/052581, filed Oct. 14, 2010—pp. 1-8.

(Continued)

*Primary Examiner* — Duy T Nguyen
(74) *Attorney, Agent, or Firm* — Brinks Gilson & Lione (57) ABSTRACT

A new method for forming an array of high aspect ratio semiconductor nanostructures entails positioning a surface of a stamp comprising a solid electrolyte in opposition to a conductive film disposed on a semiconductor substrate. The surface of the stamp includes a pattern of relief features in contact with the conductive film so as to define a film-stamp interface. A flux of metal ions is generated across the film-stamp interface, and a pattern of recessed features complementary to the pattern of relief features is created in the conductive film. The recessed features extend through an entire thickness of the conductive film to expose the underlying semiconductor substrate and define a conductive pattern on the substrate. The stamp is removed, and material immediately below the conductive pattern is selectively removed from the substrate. Features are formed in the semiconductor substrate having a length-to-width aspect ratio of at least about 5:1.

20 Claims, 7 Drawing Sheets

(51) Int. Cl.
*B82Y 10/00* (2011.01)
*B82Y 40/00* (2011.01)
*H01L 29/06* (2006.01)

(56) References Cited

U.S. PATENT DOCUMENTS

| | | | |
|---|---|---|---|
| 2005/0170621 A1* | 8/2005 | Kim et al. | 438/584 |
| 2005/0191419 A1 | 9/2005 | Helt | 427/256 |
| 2006/0009003 A1 | 1/2006 | Romano et al. | 438/382 |
| 2007/0036951 A1* | 2/2007 | Nguyen et al. | 428/209 |
| 2007/0215480 A1* | 9/2007 | Fang et al. | 205/118 |

OTHER PUBLICATIONS

Chan, Candace K. et al., "*High Performance Lithium Battery Anodes Using Silicon Nanowires*," Nature Nanotechnology, 3 (2008), pp. 31-35.

Chun, Ik Su et al., "*Nanoscale Three Dimensional Pattern Formation in Light Emitting Porous Silicon*," Applied Physics Letters, 92 (2008) pp. 191113-1-191113-3.

Fang, Hui et al., "*Silver Catalysis in the Fabrication of Silicon Nanowire Arrays*," Nanotechnology, 17 (2006) pp. 3768-3774.

Fang, Hui et al., "*Fabrication of Slantingly-Aligned Silicon Nanowire Arrays for Solar Cell Applications*," Nanotechnology, 19 (2008) 255703, 1-6 pp.

Hadjersi, T. et al., "*Blue Luminescence from Porous Layers Produced by Metal-Assisted Chemical Etching on Low-Doped Silicon*," Vacuum 80 (2005) pp. 366-370.

Hochbaum, Allon I. et al., "*Enhanced Thermoelectric Performance of Rough Silicon Nanowires*,"Nature, 451, (2008) pp. 163-167.

Huang, Zhipeng et al., "*Extended Arrays of Vertically Aligned Sub-10 nm Diameter [100] Si Nanowires by Metal-Assisted Chemical Etching*," Nano Letters, 8, 9 (2008) pp. 3047-3051.

Jensen Traci R. et al., "*Nanosphere Lithography: Surface Plasmon Resonance Spectrum of a Periodic Array of Silver Nanoparticles by Ultraviolet—Visible Extinction Spectroscopy and Electrodynamic Modeling*," J. Phys. Chem B. 103 (1999), pp. 2394-2401.

Kandala, A. et al., "*General Theoretical Considerations on Nanowire Solar Cell Designs*," Phys. Status Solidi A, 206, 1 (2009) pp. 173-178.

Nassiopoulos, A. G. et al., "*Electroluminescent Device Based on Silicon Nanopillars*," Applied Physics Letters, 69, 15 (1996) 3 pp. 2267-2269.

Oh, Sang Ho et al., "*Point Defect Configurations of Supersaturated Au Atoms Inside Si Nanowires*," Nano Letters, 8, 4 (2008) pp. 1016-1019.

Peng, Kuiqing et al., "*Ordered Silicon Nanowire Arrays Via Nanosphere Lithography and Metal-Induced Etching*," Applied Physics Letters, 90, 16 (2007) pp. 163123-1-163123-3.

Sinha, Sanjiv et al., "*Thermal Transport in Rough Silicon Nanowires for Thermoelectric Applications*," MRS Proceedings, 1166, 166-N04-07 (2009) pp. 5.

Westwater, J. et al., "*Growth of silicon nanowires via gold/silane vapor-liquid-sold reaction*," Journal of Vacuum Science & Technology B, 15, 3 (1997) pp. 554-557.

Yasukawa Y. et al., "*Site-Selective Chemical Etching of GaAs Through a Combination of Self-Organized Spheres and Silver Particles as Etching Catalyst*," Electrochemistry Communications, 10, 5 (2008) pp. 757-760.

Zhang, Ming-Liang et al., "*Preparation of Large-Area Uniform Silicon Nanowires Arrays through Metal-Assisted Chemical Etching*," Journal of Physical Chemistry C, 112, 12 (2008) pp. 4444-4450.

\* cited by examiner

FIG. 3A  
Ag Pattern

FIG. 3B  
3 min in 3:1 HF:$H_2O_2$

FIG. 3C  
3 min in 3.75:1 HF:$H_2O_2$

| Cathode reaction (at metal): | Anode reaction (at Si): |
|---|---|
| $2Ag + 2HF - 2AgF + H_2$ | $Ag^+ + Si + 4HF \rightarrow Ag + SiF_4 + 4H+$ |
| $H_2O_2 + 2H^+ \rightarrow 2H_2O + 2h^+$ | $Si + 4h^+ + 4HF \rightarrow SiF_4 + 4H^+$ |
| $2H^+ + 2e^- \rightarrow H_2 \uparrow$ | $SiF_4 + 2HF \rightarrow H_2SiF_6$ |

Overall reaction:  
$Si + H_2O_2 + 6HF \rightarrow 2H_2O + H_2SiF_6 + H_2 \uparrow$

FIG. 6

FIG. 7A SEM
FIG. 7B CL at 350 nm
FIG. 7C CL at 470 nm

METHOD OF FORMING AN ARRAY OF HIGH ASPECT RATIO SEMICONDUCTOR NANOSTRUCTURES

FEDERALLY SPONSORED RESEARCH OR DEVELOPMENT

The invention described herein is based at least in part upon work supported by the National Science Foundation under NSF Award #0749028 (CMMI) for The Center for Nanoscale Chemical-Electrical-Mechanical Manufacturing Systems. The U.S. Government has certain rights in this invention.

RELATED APPLICATIONS

The present patent document is the national stage of International Application No. PCT/US2010/052581, which was filed on Oct. 14, 2010, and which claims the benefit of the filing date under 35 U.S.C. §119(e) of U.S. Provisional Patent Application Ser. No. 61/253,700, which was filed on Oct. 21, 2009, both of which are hereby incorporated by reference in the entirety.

U.S. patent application Ser. No. 12/122,967, which was filed on May 19, 2008, U.S. patent application Ser. No. 11/376,908, which was filed on Mar. 16, 2006, International Patent Application No. PCT/US2007/064132, which was filed on Mar. 16, 2007, and International Patent Application No. PCT/US2009/055590, which was filed on Sep. 1, 2009, are hereby incorporated by reference in their entirety.

BACKGROUND

High aspect ratio 3D semiconductor nanostructures, such as silicon nanowires, may have a profound effect on the design and performance of many types of devices, including batteries, solar cells, detectors and thermoelectric systems. To produce silicon nanowires, either a bottom-up growth method based on a metal catalyzed vapor liquid solid (VLS) mechanism or a top-down method based on lithography and etching are typically used. The VLS method generates nanowires with smooth sidewalls, and nanowire diameter and orientation may in principle be controlled by epitaxial growth on appropriate substrates. However, uniformity and scalability remain as challenges for the bottom-up growth paradigm.

Si light emission was first discovered by Canham in 1990 and emission in the entire visible as well as ultraviolet (UV) light range is of interest for various applications. Traditionally, blue and UV light emission from silicon has been obtained through the sonication of porous silicon and immersion in $H_2O_2$ for several hours to generate small discrete nanoparticles. It is desirable to have a method that can produce tunable light emission/absorption over a broad range of the electromagnetic spectrum—from IR to UV—in a manufacturable fashion.

BRIEF SUMMARY

A new method for forming arrays of high aspect ratio semiconductor nanostructures with controlled size, morphology and orientation is set forth herein. The nanostructures show promise for use in applications such as solar cells, thermoelectric materials, and Li batteries.

The method entails positioning a surface of a stamp comprising a solid electrolyte in opposition to a conductive film disposed on a semiconductor substrate. The surface of the stamp includes a pattern of relief features in contact with the conductive film so as to define a film-stamp interface. The relief features have at least one lateral dimension of about 1 micron or less in size. A flux of metal ions is generated across the film-stamp interface, and a pattern of recessed features, which is complementary to the pattern of relief features on the surface of the stamp, is created in the conductive film. The recessed features extend through an entire thickness of the conductive film to expose the underlying semiconductor substrate and define a conductive pattern on the substrate. The stamp is removed, and material immediately below the conductive pattern is selectively removed from the semiconductor substrate. Features are formed in the semiconductor substrate having a length-to-width aspect ratio of at least about 5:1, and thus an array of high aspect ratio semiconductor nanostructures is created.

BRIEF DESCRIPTION OF THE DRAWINGS

FIGS. 2A-2L are scanning electron microscope (SEM) images of actual three-dimensional silicon nanostructures produced using S4 and MacEtch.

DETAILED DESCRIPTION

The inventors have developed a hybrid method for forming three-dimensional (3D), high aspect ratio semiconductor nanostructures with lateral dimensions in the range of about 10-1000 nm. The hybrid method combines a non-lithographic metal patterning technique with an open-circuit metal-assisted chemical etching process. The first key element of the method is an electrochemical stamping process, "S4," that allows high throughput patterning of conductive materials with nanoscale two-dimensional patterns of arbitrary shapes. The second key element of the method is a simple and rapid metal-assisted chemical etching process ("MacEtch") for producing nanostructured semiconductors, where selective removal of the semiconductor is assisted by a metal catalyst under a wet etching environment without an external bias.

The inventors believe the hybrid technology provides a viable path for wafer scale manufacturing of 3D functional semiconductor nanostructures with extremely high aspect ratios. Arrays of 3D semiconductor nanostructures of various geometries, including linear and curved, discrete and interconnected can be readily formed, and tunable red-green-blue emissions from silicon nanowires may be obtained. The structure and optical properties of the semiconductor nanostructures may be tuned by controlling various parameters, including the etching solution concentration, etching time, semiconductor wafer crystal orientation, and metal catalyst type, as described further below.

Figure 1A:
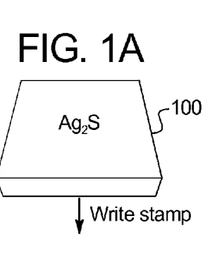
FIGS. 1A-1I are schematics showing steps in the S4–MacEtch process and exemplary resulting semiconductor nanostructures.
Figure 1B:
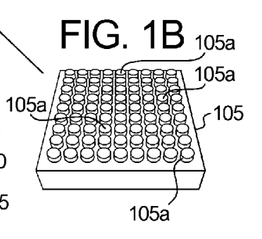
Figure 1C:
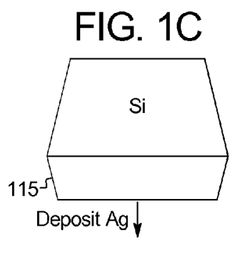
Figure 1D:
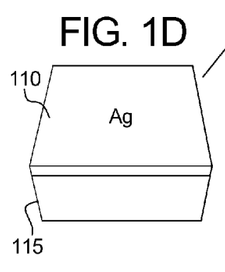
Figure 1E:
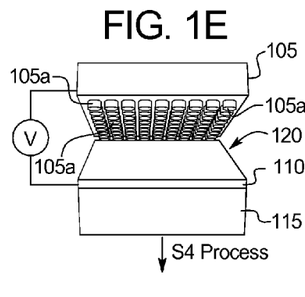
Figure 1F:
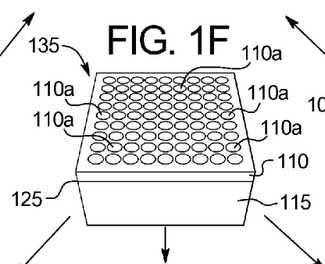

An overview of the hybrid S4–MacEtch fabrication method is provided in reference to FIGS. 1A-1I. The S4 part of the process employs a stamp made of solid electrolyte such as $Ag_2S$ or Nafion, which includes mobile metal ions. First, the solid electrolyte surface 100 is cast, molded or (ion) milled with a desired pattern of relief features 105a to produce a stamp 105, as shown schematically in FIGS. 1A and 1B. The relief features 105a of the stamp 105 are then brought into contact with a metallic film 110 deposited on a semiconductor substrate 115 (as depicted in FIGS. 1C and 1D) to form a film-stamp interface 120, as indicated in FIG. 1E. Upon applying a suitable electrical bias (typically, less than about 1V) between the stamp 105 and the metal film 110, solid-state anodic dissolution takes place and produces a current associated with ion flux across the film-stamp interface 120. Current flow in the solid electrolyte is accompanied by mass transport, that is, the motion of dissolved ions. As the dissolution progresses, metal ions from the metallic film 110 continuously dissolve into the stamp 105 at the interface 120, so that the metallic film 110 is patterned to have a profile 110a which is complementary to that of the stamp 105. Using this process, pattern transfer, as shown schematically in FIG. 1F, may be accomplished directly by electrochemical means without the use of liquid reactants or solvents.

Figures 1G, 1H:
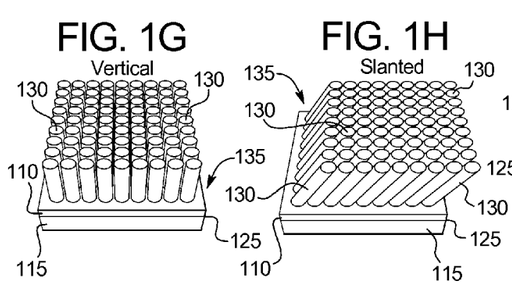
Figure 1I:
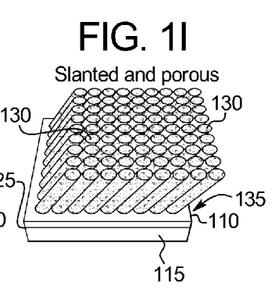

The next key element of the process, MacEtch, relies on the inventors' recognition that any metallic pattern that can be formed on a semiconductor surface may be transferred into the semiconductor body when exposed to a solution that contains an oxidant (e.g., hydrogen peroxide ($H_2O_2$) or nitric acid ($HNO_3$) and hydrofluoric acid (HF). Using this technique, high aspect ratio semiconductor nanostructures may be formed, as shown schematically in FIGS. 1G-1I. Material removal occurs directly underneath the metal 110 due to a rapid catalytic etching reaction at the metal-semiconductor interface 125. The metal 110 acts as a local cathode and a catalyst to promote the reduction of the oxidants and generate free holes ($h^+$) at the metal-semiconductor interface 125. The metal 110 travels downward as the semiconductor 115 is removed beneath it, maintaining a metal-semiconductor junction 125 and enabling continuous etching under the catalyst metal 110. By controlling the process conditions, materials, and metallic pattern, the structure, size and orientation of the resulting nanostructures 130 may be controlled. FIG. 1G depicts an exemplary array of vertically oriented nanowires 130a; FIG. 1H shows an exemplary array of slanted nanowires 130; and FIG. 1I depicts an exemplary array of slanted and porous nanowires 130.

Figure 2A:
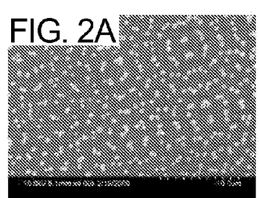
FIGS. 2A, 2D, 2G, and 2J are silver patterns generated by the electrochemical stamping process S4.
Figure 2B:
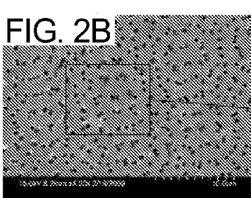
FIGS. 2B-2C, 2E-2F, 2H-2I, and 2K-2L show the corresponding silicon structures obtained from the MacEtch process at two different magnifications.
Figure 2C:
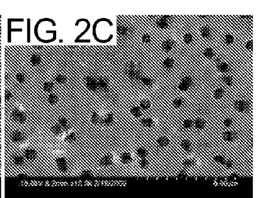
Figure 2D:
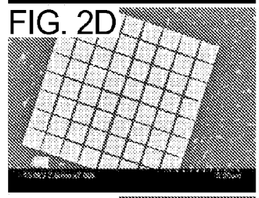
Figure 2E:
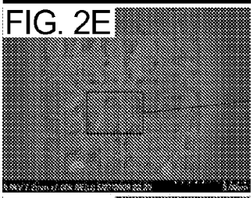
Figure 2F:
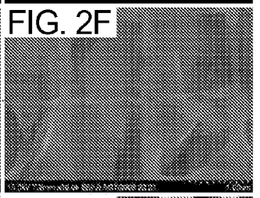
Figure 2G:
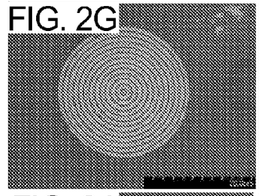
Figure 2H:
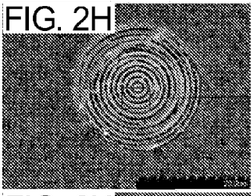
Figure 2I:
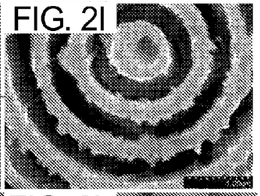
Figure 2J:
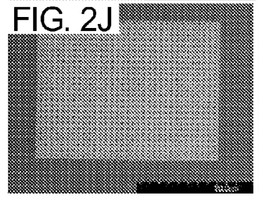
Figure 2K:
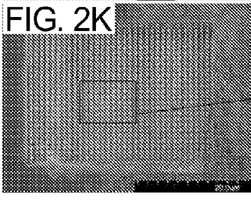
Figure 2L:
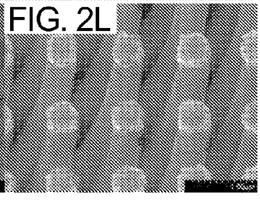

FIGS. 2A-2L are scanning electron microscope (SEM) images of actual three-dimensional silicon nanostructures produced using S4 and MacEtch. FIGS. 2A, 2D, 2G, and 2J are silver patterns generated by the electrochemical stamping process and FIGS. 2B-2C, 2E-2F, 2H-2I, and 2K-2L show corresponding silicon structures at two different magnifications (higher magnification in column of images on far right) produced by carrying out the MacEtch process for 1 minute. More specifically, FIGS. 2A-2C show the conversion of metallic Ag dots on a Si surface to vias in silicon; FIGS. 2D-2F show the conversion of closely packed arrays of 1 µm×1 µm Ag squares on a silicon surface to silicon grids; FIGS. 2G-2I show the conversion of concentric Ag rings to multi-layer annular silicon shells; and FIGS. 2J-2L show the conversion of Ag grid patterns on a silicon surface to silicon nanowire arrays. The structures shown in these images demonstrate that the combined S4–MacEtch fabrication method may offer a parallel, low-cost, scalable, efficient and versatile approach for patterning three-dimensional semiconductor nanostructures in any desired spatial arrangement, including both linear and curvilinear patterns and high aspect ratios. The hybrid method has been demonstrated over a 600 µm-diameter area, and MacEtch shows consistency across a 1 cm×1 cm wafer (e.g., 6-8 Ωcm p-type Si).

Various aspects of the hybrid method are now described in detail, again in reference to FIGS. 1A-1I.

FIG. 1A is a schematic of a solid electrolyte 100, such as $Ag_2S$. The solid electrolyte is a solid state ionic conductor having an ionic conductivity selected from the range of about 0.001 S/cm to about 500 S/cm. For example, the solid electrolyte may include $Ag_2S$, $Cu_2S$, $AgI$, $RbAg_4I_5$, $Ag_3SI$, AgCuS, AgCuSe, or $Br_4Cu_{16}I_7Cl_{13}$. It may be advantageous for the solid state ionic conductor to include a metal corresponding to that of the conductive film deposited on the semiconductor. For example, $Ag_2S$ may be selected as the solid electrolyte when a silver film is deposited on the semiconductor; similarly, $Cu_2S$ may be selected as the solid electrolyte if a copper film is deposited on the semiconductor. The use of a combination of elementally matched metal film and ionic conductor may be beneficial because cations generated from the metal generally exhibit good transport properties and conductance through the matched solid state ionic conductor in the presence of an electric field. However, a combination of a metal film and solid state electrolyte that do not include a matched metal ("substitutional stamping") may also be suitable for the electrochemical patterning process. For example, a copper film may be patterned by a $Ag_2S$ stamp. Another exemplary substitutional stamping embodiment is patterning of metal by a polymer electrolyte.

A pattern of relief features 105a is created on a surface of the stamp 105, as shown in FIG. 1B, where the relief features may have at least one lateral dimension (e.g., width, length, diameter) of about 1 micron or less in size. In some cases, the lateral dimension may be about 500 nm or less in size, or about 100 nm or less in size. For example, the lateral dimension may lie in one or more of the following size ranges: from about 10 nm to about 1 micron, from about 50 nm to about 500 nm, or from about 100 nm to about 300 nm. In addition, the relief features 105a may be spaced apart a distance of about 1 micron or less. The distance between adjacent relief features 105a may also be about 500 nm or less, or about 100 nm or less. For example, the distance may lie in one or more of the following size ranges: from about 10 nm to about 1 micron, from about 50 nm to about 500 nm, or from about 100 nm to about 300 nm. The relief features 105a may protrude from the surface of the stamp 105 a distance of between about a few nanometers (e.g., 10 nm) and 1 micron. The pattern of relief features 105a may form a periodic array, or the relief features 105a may be randomly arranged. The relief features 105a may be discrete protruding features, as shown in FIG. 1B, or they may be part of a continuous network of protruding features, as would be the case if the discrete relief features 105a of FIG. 1B were recessed into the surface so as to form a complementary pattern to that shown (the complementary pattern being a continuous network of protrusions). The patterned stamp 105 may be fabricated by focused ion beam (FIB) processing, e-beam lithography or another technique. Also, a mold may be created and used repeatedly to fabricate a large number of stamps.

A metallic or other conductive film 110 is formed on a semiconductor substrate 115 by a suitable deposition technique, such as evaporation, sputtering or chemical vapor deposition, as shown schematically in FIGS. 1C and 1D. For example, a silver film 110 may be sputter deposited onto a (100) silicon substrate 115. Typically, the conductive film is deposited to a thickness of between about 1 nm and 100 nm. The conductive film 110 may include a metal such as Ag, Au, Co, Cr, Cu, Fe, Hf, Ir, Mn, Mo, Pd, Pt, Rb, Re, Rh, Ta, Ti, V, W, Zn, and/or Zr. In particular, Schottky metals are preferable for the conductive film. Silicon or other semiconductors may be used for the substrate. For example, the semiconductor substrate 115 may include Si, Ge, GaAs, InAs, or another semiconductor.

The patterned stamp 105 is positioned in opposition to the conductive film 110 on the semiconductor surface 115 such that the relief features 105a of the stamp 105 are in contact with the conductive film 110. The schematic of FIG. 1E shows a portion of the relief features 105a of the stamp 105 in contact with the conductive film 110. The points of contact between the relief features 105a and the conductive film 110 define a film-stamp interface 120. An electrical bias may be applied between the stamp 105 and the metal film 110 to generate a flux of metal ions across the film-stamp interface 120. An electrode may be in contact with an outer surface of the stamp 105. Typically, the applied electrical bias is about 1V or less.

Due to the flux of metal ions, a pattern of recessed features 110a that is complementary to the pattern of relief features 105a on the surface of the stamp 105 is formed in the conductive film 110. With continued application of the electrical bias, the recessed features 110a may extend entirely through the thickness of the conductive film 110 to expose the underlying semiconductor substrate 115, as shown schematically in FIG. 1F. Accordingly, a conductive pattern 135 may be formed on the semiconductor substrate having dimensions determined by the pattern on the surface of the stamp.

Once the desired conductive pattern 135 is obtained on the semiconductor substrate, the applied electrical bias may be removed to halt the flux of metal ions, and the solid electrolyte stamp 105 may be removed from the substrate. Using the MacEtch process as described below, the conductive pattern 135 may serve as a chemical drill to carve out three-dimensional semiconductor nanostructures 130 from the underlying semiconductor substrate 115.

The conductive pattern 135 and the semiconductor substrate 115 are immersed in an etchant solution, and, using the conductive pattern 135 as a catalyst, semiconductor material is selectively removed from the semiconductor substrate 115. The immersion preferably takes place without an external bias. The material removal proceeds from immediately below the conductive pattern 135 in a depth direction (although not necessarily a perpendicular direction with respect to the substrate surface) and features 130 are formed in the semiconductor substrate 115. In the case of single-crystal semiconductor substrates, the material removal may proceed along a crystallographic direction of the substrate, such as the <111>, <110> or <100> direction. Depending on the orientation of the substrate, material removal may proceed in a direction perpendicular to the surface of the substrate or at an oblique angle with respect to the surface of the substrate. The direction of material removal may be referred to as an "etching direction."

The features (nanostructures) 130 formed in the substrate 115 may have at least one of (a) a lateral dimension of about 1 micron or less in size and (b) a spacing therebetween of about 1 micron or less. Preferably the lateral dimension is about 500 nm or less in size and the spacing is about 500 nm or less. For example, the nanostructures 130 may have a lateral dimension that lies in one or more of the following ranges: from about 10 nm to about 1 micron, from about 50 nm to about 500 nm, or from about 100 nm to about 300 nm. Similarly, the spacing between adjacent nanostructures 130 may lie in one or more of the following ranges: from about 10 nm to about 1 micron, from about 50 nm to about 500 nm, or from about 100 nm to about 300 nm.

The nanostructures 130 also may have a length-to-width aspect ratio of at least about 5:1 and thus may be referred to as high aspect ratio features. The length-to-width aspect ratio may also be at least about 10:1, at least about 20:1, at least about 50:1, or at least about 100:1. The width (lateral dimension) of the features may be a diameter in the case of semiconductor nanostructures 130 with a substantially circular cross-section (e.g., nanowires).

The features 130 may be arranged in an ordered array comprising periodicity in one or two dimensions. Alternatively, the features 130 may have an aperiodic arrangement. The lateral size, spacing, and arrangement of the features 130 is strongly influenced by the metal pattern 135 formed on the semiconductor surface 115 prior to carrying out the MacEtch process.

As discussed in greater detail in reference to specific examples below, the concentration of the MacEtch etchant solution may have a strong influence on the etching direction and the morphology of the resulting semiconductor nanostructures. Generally, the etchant solution comprises hydrofluoric acid (HF) and an oxidant in a concentration ratio in the range of from about 0.67:1 to about 3:1. For example, the concentration ratio may lie in the range of from about 1:1 to about 2.5:1. The concentration ratio may also lie in the range of from about 1.5:1 to about 2:1. Generally speaking, lower concentrations of HF lead to substantially solid nanostructures, whereas higher concentrations of HF lead to nanostructures with increased porosity and/or surface roughness. Typically, the oxidant employed in the MacEtch process is hydrogen peroxide ($H_2O_2$), nitric acid ($HNO_3$), $AgNO_3$, $KMnO_4$, or $Na_2S_2O_8$.

An advantage of the method is that the nanostructures 130 formed in the semiconductor substrate 115 may be highly aligned with each other, with the spacing between adjacent features varying by only a small amount along the length of the features 130. The features 130 may be substantially linear along the length, or they may be curvilinear. In the case of linear features, they may be aligned substantially perpendicular to the surface of the substrate, or they may be disposed at an oblique angle with respect to the surface.

The time duration of the material removal (etching) influences the length of the nanostructures 130 formed in the semiconductor substrate 115. Typical etch times are from several seconds to several minutes. For example, the time duration of material removal may be from about 10 seconds to about 10 minutes. Generally, the time duration is from about 30 seconds to about 5 minutes, from about 30 seconds to about 3 minutes, or from about 1 minute to about 3 minutes. Nanowires of lengths (depths) of up to tens of microns (e.g., 80-90 microns) have been demonstrated to date using the S4–MacEtch process, and the fabrication of nanowires of up to hundreds of microns long is feasible with the method. Besides length, the time duration of the MacEtch process may also influence the morphology of the nanostructures. As described further below in examples of the formation of silicon nanowires by Ag-assisted MacEtch, sidewalls of the nanowires may become rougher with increasing etching time.

Semiconductor removal can be achieved through MacEtch with varied etch rate and geometry regardless of the semiconductor doping type and level. The depth of the etched features may be controlled by etching time, as noted above. The generated holes ($h^+$) follow two different routes—they are either consumed right away by reacting with the semiconductor (e.g., silicon) in immediate proximity (resulting in the removal of the semiconductor directly in contact with the metal), or they diffuse out before the reaction (resulting in a porous region off the metal). Thus, the final semiconductor nanostructure generated can be controlled by the type of metal (Ag, Au, Pt, Ti, etc.) employed for the pattern, the metal feature size and spacing, the etchant concentration ($H_2O_2$/($HF+H_2O_2$)), substrate doping type and level, and crystal orientation.

EXAMPLES

In the following examples, S4 is combined with MacEtch to fabricate large area silicon nanowire arrays and other high aspect ratio nanostructures with controlled morphological and optical properties. The focus is S4 patterning of silver nanoscale metallic patterns on silicon wafers and subsequent metal-assisted chemical etching in a HF and $H_2O_2$ solution. Through spatially resolved optical spectroscopy and imaging using cathodoluminescence (CL), emission in the red, green and blue color range resulting from Si nanowire structures is demonstrated. The emission may be tuned by varying the etching solution concentration, etching time, and crystal orientation. Furthermore, through the removal of the silver pattern and re-deposition of a silver film on the silicon nanowires, a plasmonic enhancement of the blue emission is verified. The advantages of the S4 and MacEtch combination and the unique features of the nanostructures produced using this technique, as well as potential applications in areas including energy storage and conversion, are also described.

Stamps for S4 are written in $Ag_2S$ using a FEI Dual Beam FIB. 30 nm of Ag is evaporated using a CHA evaporator on a clean piece of Si wafer. For p-type silicon, the resistivity is from 4-6 Ωcm. N-type samples are done on an SOI wafer with a device layer resistivity of from 1-10 Ωcm and a thickness of about 2 microns; the thickness of the device layer is significantly greater than the etch depth.

As illustrated in FIGS. 1E and 1D, the inverse of the $Ag_2S$ pattern is stamped into the Ag as the stamp is contacted to the Ag-coated Si sample and a voltage is applied. After stamping, samples are etched in solutions containing various amounts of $H_2O_2$, HF and EtOH for a period of 30 seconds to 3 min. The Ag is then removed using first a 7.5 minute etch of $H_2O_2$/$NH_4OH$ followed with a 5 minute concentrated $HNO_3$ etch. After Ag removal, 12 nm of Ag is redeposited to study the plasmonic effect. Resulting nanostructures are characterized using a Hitachi S4800 scanning electron microscope (SEM) for morphology, and cathodoluminescence spectroscopy and imaging in a JEOL 7000F SEM for spatially resolved optical characterization at various stages, including directly after etching, after Ag removal and after Ag redeposition.

It is known that metallic Ag can be etched by a HF solution; however, in the case of MacEtch, it appears that the Ag pattern remains on the silicon, presumably because dissolved Ag+ is reduced by Si when directly in contact and keep it from being dissolved. To test this hypothesis, a 5 nm Cr adhesion layer is deposited between the silicon and the Ag layer. This results in the Ag layer's being completely etched away, and the etching of silicon stops at that point since Cr does not act as a catalyst for the reduction of $H_2O_2$. This confirms the intimate contact relationship between metal and the semiconductor necessary in MacEtch. The continuous local oxidation and subsequent reduction of Ag is the mechanism for the injection of holes into Si, which is balanced by $H_2O_2$. The reduction of Ag appears to be important for generating roughened, solid nanostructures, as discussed further below. This is in contrast to MacEtch using Au or Pt, where the metal acts primarily or entirely as a catalyst and may not participate in the reaction.

Figure 3A:
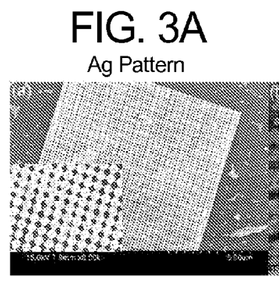
FIGS. 3A-3C are the MacEtch results for S4 generated Ag patterns under different MacEtch etching concentrations for p-(100) silicon wafers.
Figure 3B:
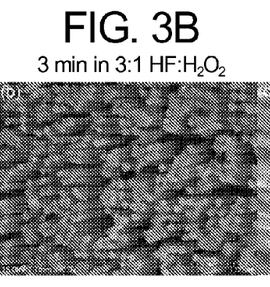
Figure 3C:
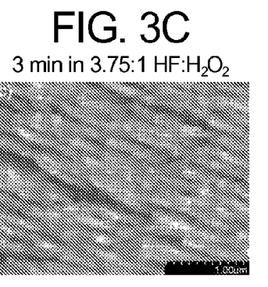

Effect of MacEtch Concentration: [HF]:[$H_2O_2$] on Nanowire Direction and Porosity The ratio of HF to $H_2O_2$ in the MacEtch solution affects both the etching direction and wire morphology. Shown in FIGS. 3A-3C and 4A-4C are the MacEtch results for S4 generated Ag patterns under different MacEtch etching concentrations for p-(100) silicon (3A-3C) and n-(110) (4A-4C) silicon wafers, respectively. For the (100) p-Si wafer, vertical nanowires are formed at low HF/$H_2O_2$ ratios while tilted nanowires are generated when the HF ratio is increased by 25%. (The vertical direction is understood to be substantially perpendicular to the surface of the silicon wafer, whereas a tilted direction is understood to lie at an oblique angle with respect to the surface of the silicon wafer.) The tilting direction is presumably <111>. In addition to the difference in directions, a variation in the morphology of the nanowires is also evident. The nanowires in FIG. 3B are solid, while those in FIG. 3C appear to be porous.

Figure 4A:
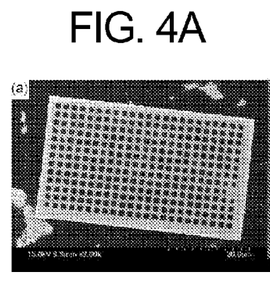
FIGS. 4A-4C are the MacEtch results for S4 generated Ag patterns under different MacEtch etching concentrations for n-(110) (4A-4C) silicon wafers.
Figure 4B:
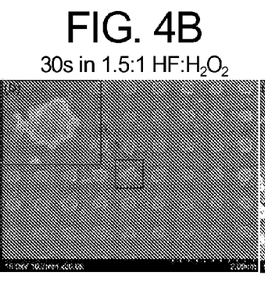
Figure 4C:
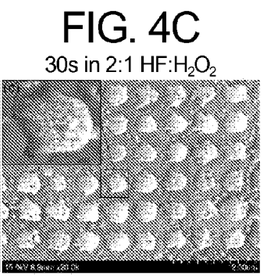

For the (110) n-Si wafer, a low HF concentration leads to solid, vertically oriented, smooth nanowires, where edge roughness is a result of the shape of the stamp only (FIG. 4B). In contrast, extremely rough and porous silicon rods (FIG. 4C) are formed at an increased HF concentration. Table I summarizes the dependence of nanowire orientation and morphology on substrate crystal orientation and etching conditions, as well as the process window.

TABLE I

Dependence of Nanowire Orientation and Porosity on Etching Conditions

| Concentration (volume HF:$H_2O_2$) | <0.67:1 | 0.67:1 to 1:1 | 1:1 to 1.5:1 | 1.5:1 to 2:1 | 2.:1 to 2.5:1 | 2.5:1 to 3:1 | >3:1 |
|---|---|---|---|---|---|---|---|
| (100) | No Pattern | Porous Vertical | Vertical | Slanted | Slanted | Porous Slanted | No Pattern |

TABLE I-continued

Dependence of Nanowire Orientation and Porosity on Etching Conditions

| Concentration (volume HF:$H_2O_2$) | <0.67:1 | 0.67:1 to 1:1 | 1:1 to 1.5:1 | 1.5:1 to 2:1 | 2.:1 to 2.5:1 | 2.5:1 to 3:1 | >3:1 |
|---|---|---|---|---|---|---|---|
| (110) | *No Pattern* | *Porous Slanted* | *Slanted* | Vertical | *Slanted* | Porous Slanted | *No Pattern* |
| (111) | *No Pattern* | *Porous Slanted* | *Slanted* | *Slanted* | *Vertical* | *Porous Vertical* | *No Pattern* |

The underlined table entries represent results that are observed here, the italicized table entries represent what has been experimentally observed but is not depicted, and the remaining two entries represent what has been demonstrated in the literature (Zhang et al., *Journal of Physical Chemistry C*, 2008, 112 (12) 4444-4450).

Figure 5:
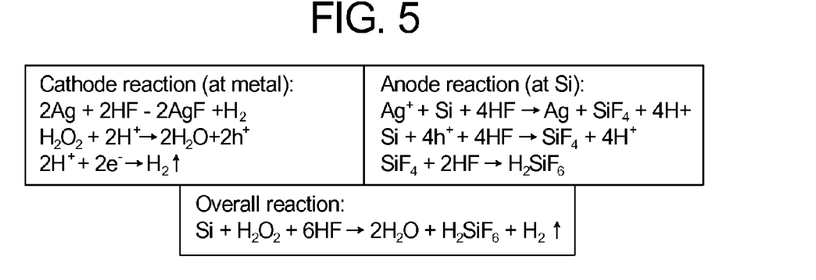
FIG. 5 shows the MacEtch reaction mechanism for a silver pattern.

The variation in morphology and orientations of nanowires produced can be explained through the MacEtch reaction mechanism, which is depicted in FIG. 5. At low [HF]/[$H_2O_2$] ratio, i.e., high relative concentrations of $H_2O_2$, silicon is readily oxidized, and a plethora of holes is available. Therefore, it is most likely that the etching will occur in the lowest packing density crystal direction, [100], as there are fewer atoms to remove. As the number of holes, $h^+$, becomes more limited as the $H_2O_2$ concentration decreases, the removal of $Si^+$ will become quicker due to a higher relative concentration of HF, leaving less time for diffusion and resulting in etching in a more densely packed direction. While the geometry and size may also affect the etching conditions, they are not expected to change the etching directions, but rather the size of each window, or they may shift the overall concentration ratio needed to achieve certain etching directions.

It is also possible to change the porosity and orientation using doping concentration. The inventors believe it is possible to get a solid to porous transition similar to that previously observed by changing the doping concentration to a less resistive substrate while keeping the etching solution and geometry constant. Whether increasing the doping concentration or decreasing the relative concentration of HF:$H_2O_2$, the essential change is the amount of carriers injected, which regulates both the porosity and the etching direction.

Effect of Nanowire Structures on Emission Wavelength and Intensity

In general, strong visible emissions from red to blue are observed at room temperature from various S4/MacEtch-produced nanostructures. However, the overall emission intensity and relative intensity in each wavelength range vary depending on the structures produced using different etching times and patterns.

Figure 6:
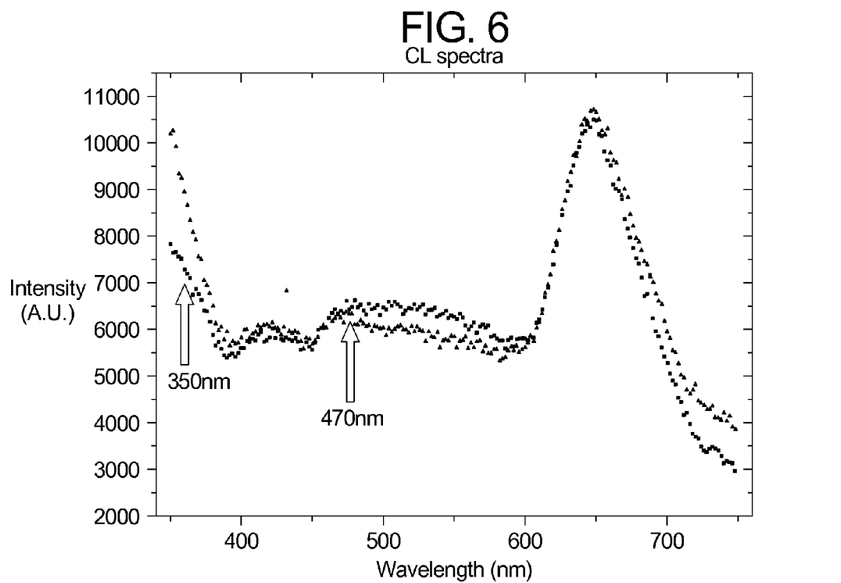
FIG. 6 shows cathodoluminescence (CL) spectra taken from two sets of nanowire arrays as-etched.
Figure 7A:
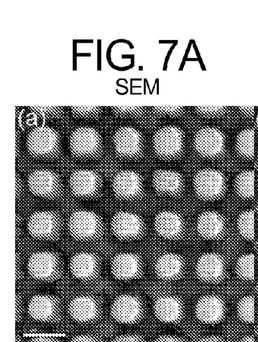
FIGS. 7A-7F show SEM and monochromatic CL images at different wavelengths from two arrays of silicon nanostructures.
Figure 7B:
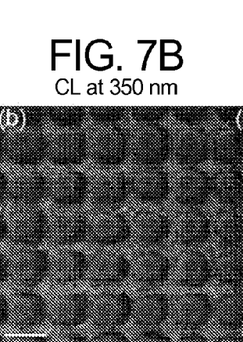
Figure 7C:
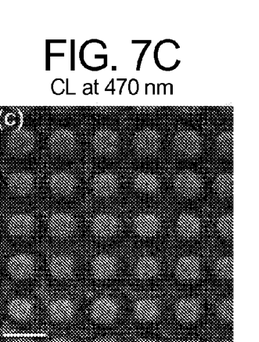
Figure 7D:
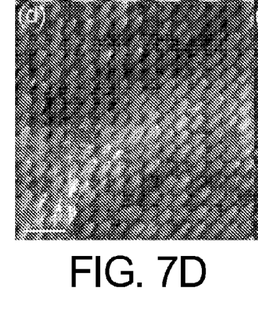
Figure 7E:
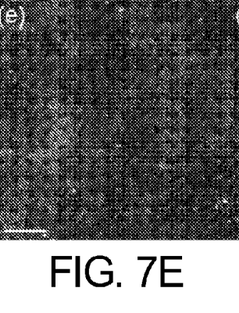
Figure 7F:
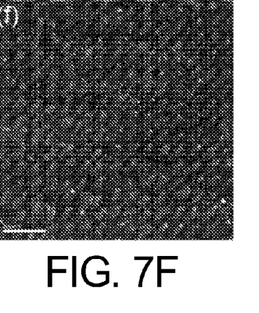

Shown in FIG. 6 are cathodoluminescence (CL) spectra taken from two sets of nanowire arrays as-etched (i.e., the Ag metallic pattern remains in the body of the silicon substrate). The CL spectra show strong emission in the UV region near 350 nm, a strong peak in the red at 648 nm, and a relatively weak broad band in between (400-600 nm). Using monochromatic CL images taken at each wavelength window (FIGS. 7A-7F), it is possible to unambiguously identify that the emission at 350 nm originates from the Ag pattern between wires (FIGS. 7B and 7E), while the emission in the blue (FIGS. 7C and 7F), green and red (not shown) comes from the silicon nanowires themselves. This indicates that silicon nanowire arrays produced by S4-patterned Ag catalyzed MacEtch are capable of emitting in the full visible wavelength range. Surprisingly, the two sets of nanowires with diameters at 100 nm and 500 nm, oriented vertically (100) and slanted (111), respectively, show amazingly similar emission wavelength and intensity. It is, however, not completely unexpected considering that the diameter range studied here (100-1000 nm) is well above the quantum confinement Bohr's radius (5 nm), and the visible emission observed here could result from surface features that are similar for both sets of nanowires rather than from the size of the nanowires.

Figure 9:
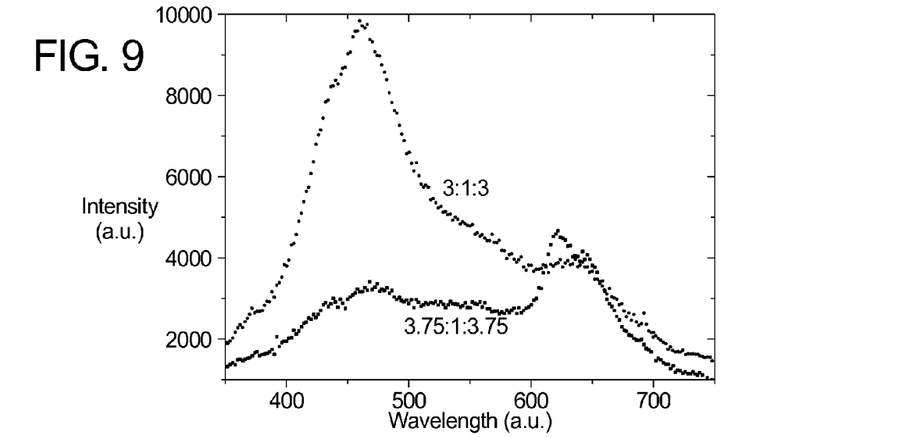
FIG. 9 shows CL spectra obtained from the silicon nanostructures of FIGS. 8A and 8B produced with different etchant concentrations.
Figure 10:
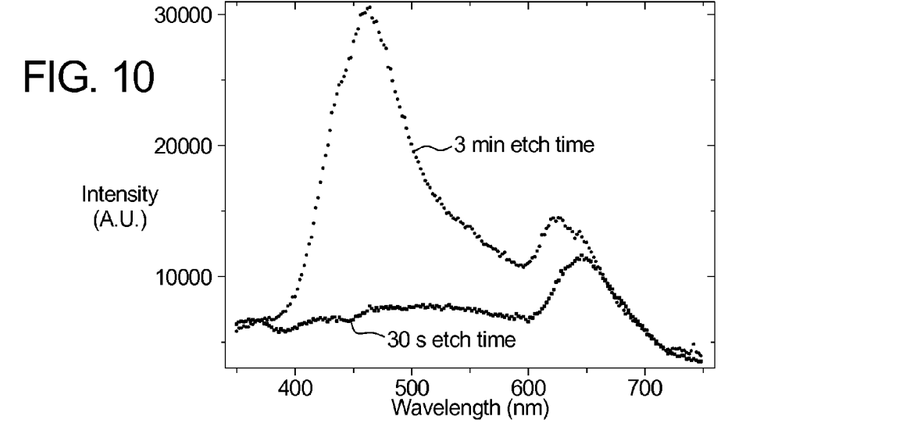
FIG. 10 shows CL spectra obtained from silicon nanostructures produced with different etching times.

Remarkably, the relative intensity in each color band, as well as the overall intensity, can be tuned by varying etchant concentration, etching time, silicon substrate properties (orientation, doping concentration) as well as the type of catalyst metal. FIGS. 9 and 10 show examples of the tunability and correlation of the emission peak position with the nanowire morphology.

Figure 8A:
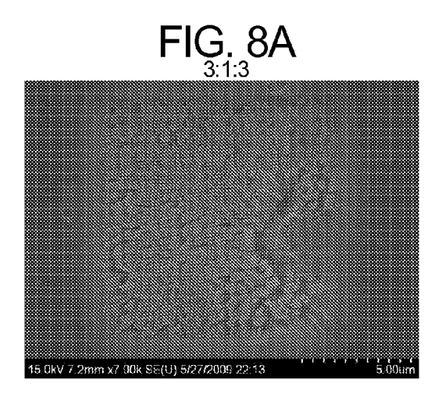
FIGS. 8A-8B are SEM images of silicon nanostructures of different morphology.
Figure 8B:
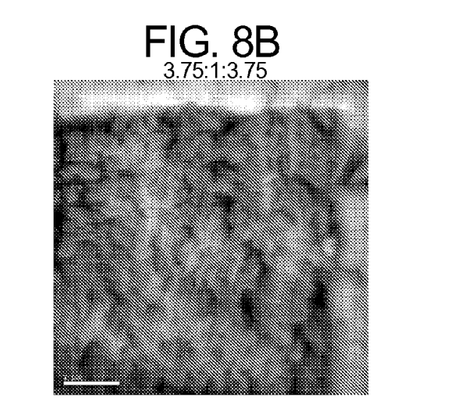

Shown in FIG. 9 is the etchant concentration effect of emission properties for nanowires produced from a p-Si (100) wafer. For MacEtch under 3.75:1:3.75 [HF]:[$H_2O_2$]:[EtOH] conditions, the dominant CL peak is ~630 nm (red color) with a broad band that covers between 400-600 nm, while reducing the [HF] concentration by 20% to 3:1:3 [HF]:[$H_2O_2$]:[EtOH], increased the blue emission ~480 nm by more than 3 times. By correlating with the SEM structures shown in FIGS. 8A and 8B, the red emission is attributed to smooth but porous nanowires, while the solid nanowires with seemingly small-scale roughness contribute to the blue emission. While blue color emission has been reported in porous silicon generated by both traditional anodic etching and large area non-patterned Ag-catalyzed MacEtch, long etching times of 45 and 15 minutes, respectively, were required to produce weak blue emission. In contrast, the S4+MacEtch-produced nanowire arrays reported here resulted only from 3 mins of etching with predominantly blue emission.

Shown in FIG. 10 is the etching time effect of emission properties for nanowires produced from a p-Si (100) wafer under 3:1:3 [HF]:[$H_2O_2$]:[EtOH]. Even though the 3 mins of MacEtch resulted in the strong blue emission peak (top trace), for a short etching time of 30 s (bottom trace), the dominant emission is red and the overall intensity is weaker. Careful examination of the morphology of the nanowire sidewalls indicates that the sidewalls become rougher with increasing etching time, presumably due to residual silver on the nanowire sidewalls.

Roughness induced enhancement of blue emission may be unique to Ag out of all the MacEtch metal catalysts. While not completely understood, it is hypothesized that Ag actually participates in the half reactions (FIG. 5). Even though there is no net consumption of Ag, some Ag particles could reside on the nanowire sidewalls randomly and MacEtch continues locally increasing the sidewall roughness over time. In contrast, samples etched using more inert metals as the catalyst, such as Au or Pt, have not been observed to emit blue wavelengths. The inventors have observed that the red emission may increase with etching time also when n-(111) silicon wafers are used. Overall, etching conditions and silicon surfaces determine the structure of the nanowires, which in turn affects the optical properties. This provides unique tunability of visible light emission from an elemental indirect band gap semiconductor like silicon and unprecedented control of its optical properties through nanofabrication.

Effect of Ag-Induced Plasmonic Effect on Nanowire Emission Properties

Another unique feature about the Ag-silicon structures produced by S4 and MacEtch is the plasmonic and photonic coupling effect due to the presence of Ag nanoparticles, which may enhance the nanowire emission.

Figure 11A:
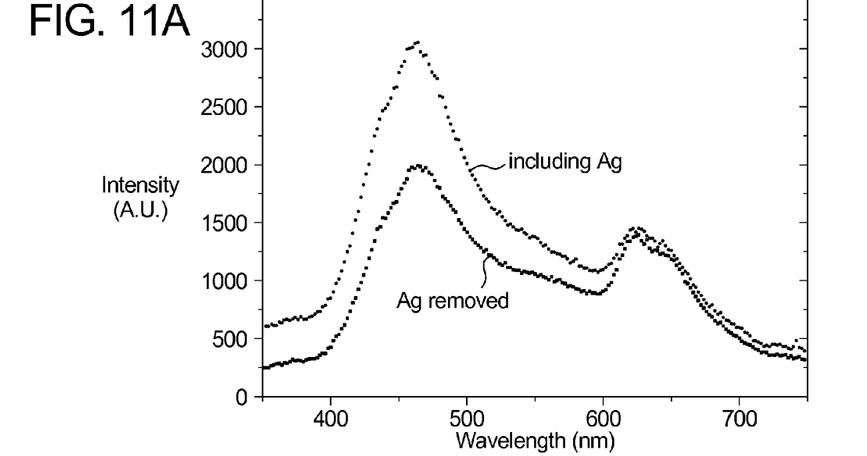
FIGS. 11A-11B are two sets of CL spectra taken from the same sample following two cycles of Ag deposition and removal from the silicon nanowires.
Figure 11B:
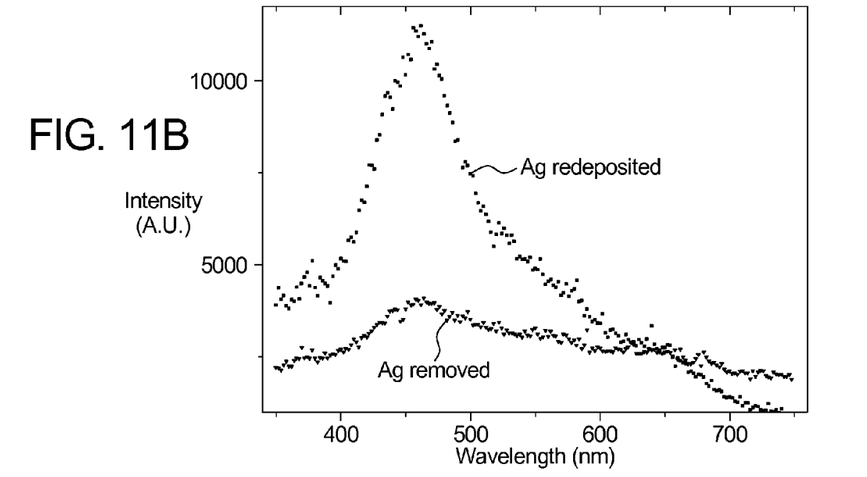
Figure 12:
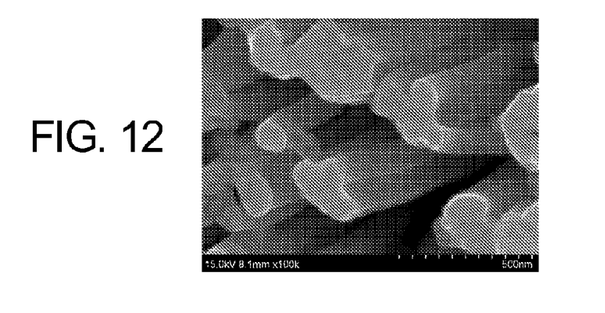
FIG. 12 is a SEM image of silicon nanostructures produced by S4 and MacEtch with the Ag removed.

Shown in FIGS. 11A-11B are two sets of CL spectra taken from the same sample following two cycles of Ag deposition and removal from the silicon nanowires. FIG. 11A shows the blue emission enhancement with the presence of Ag directly from the S4-patterned Ag after MacEtch (top trace), relative to the same structure with the Ag removed (bottom trace). FIG. 11B shows the strong blue emission again (top trace) after the intentional redeposition (evaporation) of an Ag metal film of 12 nm thick nominally (resulting in discrete Ag nanoparticles of ~50 nm or less in size), and the decrease of the blue emission after the removal of the Ag again (bottom trace). The presence and the absence of Ag can be viewed from SEM images, as well as CL images, as local bright spots indicate that a strong selectivity in the emission occurs. The inventors believe that this experiment unequivocally confirms a strong enhancement of the blue emission due to the presence of Ag. It has been observed that Ag films of approximately 10 nm strongly enhance emission for InGaN/GaN QWs at 470 nm. For smaller particles a red shift is observed in plasmonic resonance, which is observed by a lack of plasmon emission at 350 nm. By tailoring the Ag particle size, distribution and pattern, it might be possible to selectively enhance the emission of certain wavelengths and quench other wavelengths of light to provide a strongly tunable light emitting or absorbing source in the entire visible range.

Influence of Etchant Concentration on Surface Roughness of Silicon Surfaces

Figure 13:
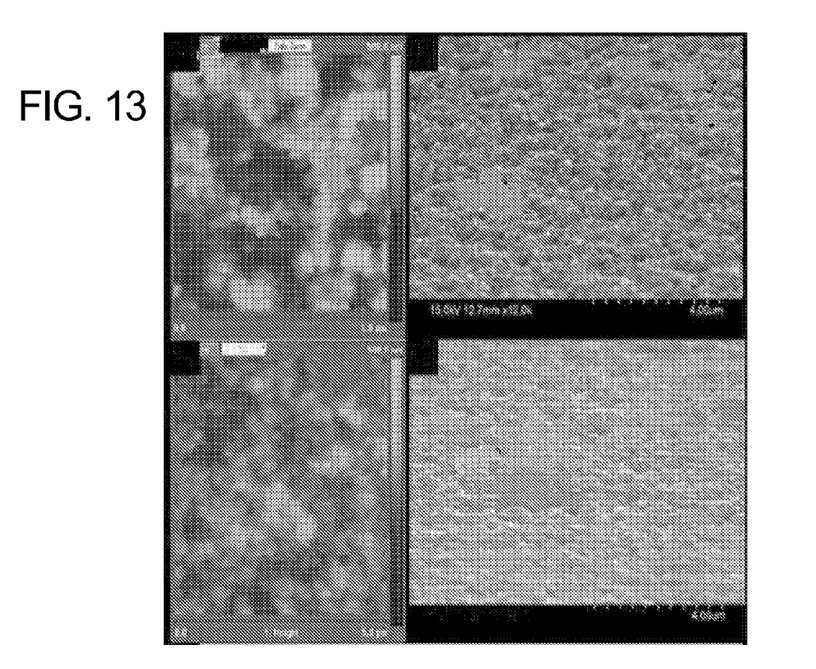
FIG. 13 shows AFM images of a Si wafer etched in (a) 6:1:6 and (c) 2:1:2 49% HF:30% $H_2O_2$:EtOH for 1.5 minutes, and SEM images (b) and (d) of the tilted surfaces.
Figure 14:
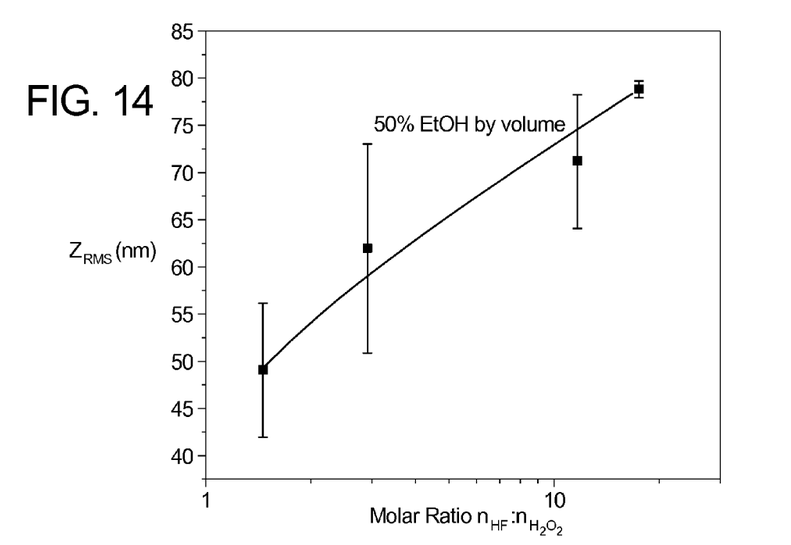
FIG. 14 is a plot of the surface roughness of the Si wafer of FIG. 13 measured by an RMS height difference as a function of molar ratio.

In addition to fabrication of periodic nanostructures, the MacEtch process can also be used to produce semiconductor surfaces with different degrees of roughness quantitatively by adjusting the etchant concentration. Shown in FIG. 14 is the AFM measured surface rms as a function of molar ratio of HF to $H_2O_2$ for MacEtch Si (100) surface coated with an unpatterned Ag film 5 nm thick for 1.5 mins, along with representative corresponding SEM and AFM images (FIG. 13). As can be seen in FIG. 14, the surface roughness as measured by a rms height difference ranges from about 50 nm to about 80 nm depending on the molar ratio of HF to $H_2O_2$. These results support the idea that the surface roughness of semiconductor nanostructures produced by S4–MacEtch may be controlled to a desired value by variation of the process conditions.

By combining electrochemical stamping and metal-assisted chemical etching, the inventors have developed a simple, high-throughput method of generating many different 3D patterns in semiconductors. The process of S4–MacEtch is a versatile technology that may generate patterns with a desired crystal orientation and optical properties. The ability to control the position, patterned crystal orientation and porosity makes S4 stamping and MacEtch a good candidate for fabricating large array of nanowires for various applications that may benefit from precise control of nanostructure arrays, such as solar cells, thermoelectric materials and Li batteries.

Although the present invention has been described in considerable detail with reference to certain embodiments thereof, other embodiments are possible without departing from the present invention. The spirit and scope of the appended claims should not be limited, therefore, to the description of the preferred embodiments contained herein. All embodiments that come within the meaning of the claims, either literally or by equivalence, are intended to be embraced therein.

Furthermore, the advantages described above are not necessarily the only advantages of the invention, and it is not necessarily expected that all of the described advantages will be achieved with every embodiment of the invention.

The invention claimed is:

1. A method of forming an array of high aspect ratio semiconductor nanostructures, the method comprising:
    positioning a surface of a stamp comprising a solid electrolyte in opposition to a conductive film disposed on a semiconductor substrate, the surface of the stamp including a pattern of relief features in contact with the conductive film so as to define a film-stamp interface, and the relief features having at least one lateral dimension of about 1 micron or less in size;
    generating a flux of metal ions across the film-stamp interface;
    creating a pattern of recessed features in the conductive film complementary to the pattern of relief features on the surface of the stamp, the recessed features extending through an entire thickness of the conductive film to expose the underlying semiconductor substrate and define a conductive pattern on the semiconductor substrate;
    removing the stamp;
    selectively removing material immediately below the conductive pattern from the semiconductor substrate; and
    forming features in the semiconductor substrate having a length-to-width aspect ratio of at least about 5:1, thereby forming an array of high aspect ratio semiconductor nanostructures.

2. The method of claim 1, wherein generating the flux of metal ions across the film-stamp interface comprises applying an electrical bias of about 1V or less between the stamp and the conductive film.

3. The method of claim 1, wherein selectively removing the material comprises immersing the conductive pattern and the semiconductor substrate in an etchant solution.

4. The method of claim 3, wherein the immersion in the etchant solution occurs without an external electrical bias.

5. The method of claim 3, wherein the etchant solution comprises hydrofluoric acid and an oxidant.

6. The method of claim 5, wherein a concentration ratio of the hydrofluoric acid to the oxidant in the etchant solution lies in the range of from about 0.67:1 to about 3:1.

7. The method of claim 6, wherein the concentration ratio lies in the range of from about 1:1 to about 2.5:1.

8. The method of claim 5, wherein the oxidant is $H_2O_2$.

9. The method of claim 1, wherein the selective removal of material occurs substantially along a crystallographic direction of the semiconductor substrate.

10. The method of claim 9, wherein the crystallographic direction is substantially perpendicular to a surface of the semiconductor substrate.

11. The method of claim 9, wherein the crystallographic direction is at an oblique angle with respect to a surface of the substrate.

12. The method of claim 1, wherein the selective removal of material is carried out for a time duration of from about 10 seconds to about 10 minutes.

13. The method of claim 12, wherein the time duration is from about 30 seconds to about 3 minutes.

14. The method of claim 1, wherein the features formed in the semiconductor substrate include pores.

15. The method of claim 1, wherein the features formed in the semiconductor substrate have a surface roughness.

16. The method of claim 15, wherein the surface roughness as measured by a RMS height difference ranges from about 50 nm to about 80 nm.

17. The method of claim 1, wherein the conductive pattern comprises silver.

18. The method of claim 1, wherein the stamp comprises $Ag_2S$.

19. The method of claim 1, wherein the array of high aspect ratio semiconductor nanostructures is an ordered array of silicon nanowires.

20. The method of claim 1, wherein the semiconductor nanostructures exhibit visible light emission.

* * * * *